United States Patent [19]

Wilmsmeyer

[11] Patent Number: 5,620,920
[45] Date of Patent: Apr. 15, 1997

[54] PROCESS FOR FABRICATING A CMOS STRUCTURE WITH ESD PROTECTION

[75] Inventor: Klaus Wilmsmeyer, Denzlingen, Germany

[73] Assignee: Deutsche ITT Industries GmbH, Freiburg, Germany

[21] Appl. No.: 613,290

[22] Filed: Mar. 11, 1996

[30] Foreign Application Priority Data

Mar. 24, 1995 [DE] Germany ............................ 195 10 777

[51] Int. Cl.[6] .............................................. H01L 21/8238
[52] U.S. Cl. ........................ 438/227; 438/233; 438/230; 438/586; 438/705; 438/934
[58] Field of Search ...................... 437/56, 57, 58, 437/34, 41 RCM, 200, 913, 59; 148/DIG. 147

[56] References Cited

U.S. PATENT DOCUMENTS

| | | | |
|---|---|---|---|
| 5,093,276 | 3/1992 | Asahina | 437/200 |
| 5,246,872 | 9/1993 | Mortensen | 437/44 |
| 5,262,344 | 11/1993 | Mistry | 437/57 |
| 5,278,084 | 1/1994 | Lee et al. | 437/34 |
| 5,397,744 | 3/1995 | Sumi et al. | 437/200 |
| 5,429,958 | 7/1995 | Matlock | 437/56 |
| 5,512,502 | 4/1996 | Ootsuka et al. | 437/200 |
| 5,516,717 | 5/1996 | Hsu | 437/56 |
| 5,529,941 | 6/1996 | Huang | 437/34 |
| 5,532,178 | 7/1996 | Liaw et al. | 437/57 |

*Primary Examiner*—Michael Trinh
*Attorney, Agent, or Firm*—Plevy & Associates

[57] ABSTRACT

A process is disclosed for fabricating a CMOS structure with ESD protection. The outside transistors are covered with a protective oxide layer which is so masked as to cover the areas of the respective source and drain regions adjoining the field-oxide regions and the gate regions. The protective oxide layer is then subjected to a heat treatment, after which a siliciding process is carried out.

10 Claims, 1 Drawing Sheet

5,620,920

PROCESS FOR FABRICATING A CMOS STRUCTURE WITH ESD PROTECTION

FIELD OF THE INVENTION

The present invention relates generally to semiconductor transistors and more specifically to a process for fabricating a complementary insulated-gate field-effect transistor structure (CMOS structure) with protection against electrostatic discharge (ESD protection).

BACKGROUND OF THE INVENTION

In a CMOS device, ESD protection is very important if the source and drain regions of the outer transistors of the integrated circuit (IC) are silicided. As a result, these source and drain regions have very low resistivity. In the areas of the respective source and drain regions adjoining the field-oxide regions and the gate regions, including the spacers, very high field strengths can be produced. Through charge carrier multiplications, current paths may then be provided in these regions, which, because of the low series resistance of silicided leads, can result in the device being destroyed. The input and output transistors are particularly affected, because high charging voltages of approximately 1000 V are frequently developed there. To avoid such current paths, a special SALICIDE process is carried out. In this process, those areas of the source and drain regions of the respective outer transistors (output, input, protective transistors) which adjoin the field oxide regions and the spacers of the gate regions are protected from the siliciding by a protective oxide layer. This layer is relatively thin and is deposited by a chemical vapor deposition (CVD) process. The layer is suitably patterned using an ESD mask to form a masked or masking protective oxide layer. The masking protective oxide layer is commonly formed by a photoresist process and a subsequent etching process. The subcircuits of the integrated circuit (IC) which are not connected directly to the outside world, which is generally the case for the greater part of the IC, need not be directly protected. From these, therefore, the protective oxide layer is completely removed in the etching step. Details of the other steps involved in fabricating the CMOS device which are not described here are familiar to those skilled in the art.

A CMOS device with ESD protection has been described in U.S. Pat. No. 5,262,344 entitled "N-CHANNEL CLAMP FOR ESD PROTECTION IN SELF-ALLIGNED SILICIDED CMOS PROCESS" which was issued to K. R. Mistry and assigned to the Digital Equipment Corporation. The ESD protection device in this patent is formed in an integrated circuit by a N-channel grounded-gate transistor. The siliciding of the protection device is controlled so that the adverse effects of ESD events are minimized. There are no silicided areas created on top of the polysilicon gate of the protection transistor, nor on the source/drain regions near the gate and self-aligned with the gate, in contrast to the siliciding of other transistors made by the CMOS process.

In the process of forming a CMOS device, a problem arises involving the masking protective oxide layer which is deposited on other oxides, such as the field and spacer oxides. This masking protective oxide layer is removed from the field and spacer oxides, particularly in the inner portion of the IC, by etching. The problem arises in that the field and spacer oxides may be damaged by these etching processes. It is very important, however, that field and oxide spacers remain undamaged in the process, because otherwise the configuration and circuit parameters of the IC will change.

The '344 patent, discussed above, does not address the problem of etching processes on the field and spacer oxides which may be damaged by these processes.

It is therefore an object of the present invention to improve the process of fabricating a CMOS structure in such a way that the circuit parameters of the device are not changed, and reliable ESD protection is ensured.

SUMMARY OF THE INVENTION

The present invention relates to a process for fabricating a CMOS structure comprising the steps of forming, in a substrate of a first conductivity type, at least one well region of a second conductivity type. Field-oxide regions and gate-oxide regions are then formed on the transistor structure. Source and drain regions associated with the respective gate-oxide regions are then formed. These source and drain regions are of a second conductivity type in the substrate, and of a first conductivity type in the well region. A protective oxide layer is then deposited on the structure covering the source and drain regions. This oxide layer is masked so as to cover those areas of the respective source and drain regions of the transistors which adjoin the field-oxide regions and the gate regions. The CMOS structure is completed by siliciding it with a protective oxide layer.

BRIEF DESCRIPTION OF THE DRAWINGS

In order to better understand the present invention, reference should be made to the following detailed description taken in conjunction with the accompanying drawings wherein.

DETAILED DESCRIPTION OF THE INVENTION

A CMOS structure having ESD protection is attained in the present invention by a method wherein the masking protective oxide layer has a greater etch rate than the field-oxide regions and the spacers adjoining the gates. The greater etch rate of the masking protective oxide layer is achieved in the present invention by using CVD-oxide deposition. Then it is subjected to a heat treatment (prior to the siliciding step) whose parameters are so chosen as to reduce the etch rate of the protective oxide layer. A greater etch rate of the protective oxide layer as compared to that of the field-oxide regions and the spacers adjoining the gate regions is necessary for a selective etching process during the masking of the protective oxide layer in order that the corresponding field-oxide regions and spacers, particularly in the inner portion of the IC, are damaged as little as possible. Sufficient selectivity for this etching process is provided, for example, by CVD oxides.

Figure 1:
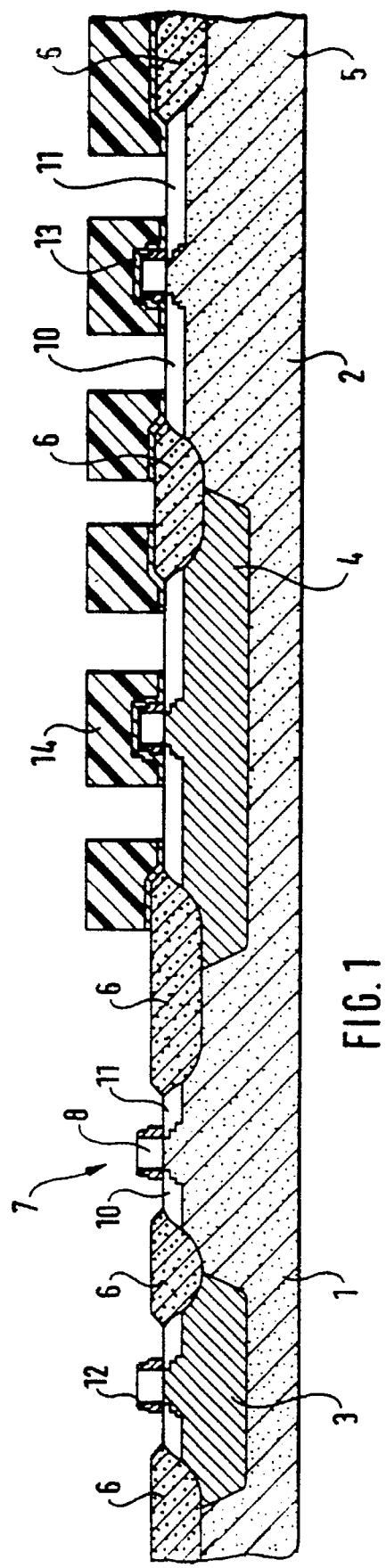
FIG. 1 shows an embodiment of a CMOS structure fabricated by the method according to the present invention, after the etching of the protective oxide layer.

Referring to FIG. 1, there is shown a part of a CMOS structure which has an inner portion 1 and an edge portion 2. The standard CMOS construction process has been carried out to the point that well regions 3 and 4 have been formed both in the inner portion 1 and in the edge portion 2. It is assumed by way of example that the substrate 5 is a p-type silicon substrate. The well regions 3 and 4 are then n-type doped. Furthermore, according to well known CMOS construction processes, field-oxide regions 6 have been formed both in the inner portion 1 and in the edge portion 2 of the structure. Field-effect transistors 7 are provided having gates 8 and associated source and drain regions 10, 11. The gates 8 are constructed from polysilicon. Spacers 12 of silicon oxide prevent the high dopant concentration for the source region 10 and the drain region 11 from reaching the area below the gate 8.

Still referring to FIG. 1, the edge portion 2 of the IC contains a masking protective oxide layer 13 for the subsequent siliciding processes. The protective oxide layer 13 is formed by depositing a relatively thin protective oxide layer on the CMOS structure using a CVD process, and patterning the protective oxide layer using an ESD mask. The patterning is commonly carried out by a photoresist process and subsequent etching. The necessary photoresist layer 14 is shown in FIG. 1. As can be seen in the figure, the protective oxide layer 13 is so masked that of the outer transistors, (i.e., of the transistors 7 in the edge portion 2 of the IC), the areas of the respective source regions 10 and drain regions 11 adjoining the field-oxide regions 6, and the gate regions 8, as well as the field-oxide regions 6 and the gate regions 8, including the spaces 12, are covered.

Figure 2:
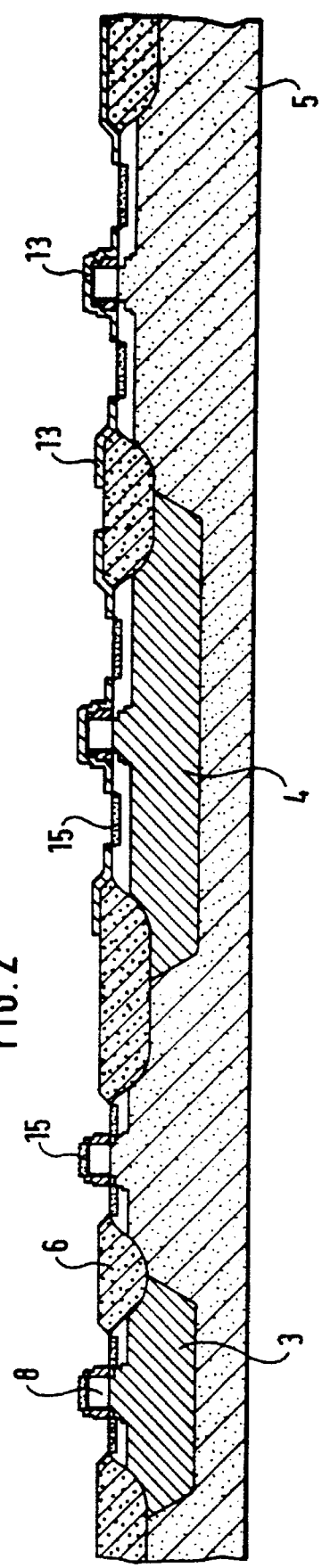
FIG. 2 shows the CMOS structure of FIG. 1 after the siliciding process.

Referring now to FIG. 2, the CMOS structure is silicided according to well known procedures familiar to those skilled in the art. The metal used in the siliciding process (e.g., titanium) reacts with silicon, but not with silicon oxide. Where the silicon is not covered with silicon oxide, silicided regions 15 are formed. Thus, according to the process described herein for the IC device depicted in FIG. 1, the inner areas of the source regions 10 and drain regions 11 in the edge portion 2 of the IC device are silicided. The entire source regions 10, drain regions 11, and gate regions 8 in the inner portion 1 of the IC device are also silicided in the process. It has been observed that when protective oxide layers with a high etch rate, particularly CVD oxide layers, are used without a heat treatment, oversiliciding is observed. This overosiliciding is visible at the edges of the protective oxide layer, where silicide spikes form in the protected areas of the source and drain regions. Such spikes, particularly in the case of small structures, may lead to very high electric field strengths, whereby the ESD protection would be reduced. According to the present invention, the masked oxide layer will be subjected to a heat treatment (discussed later) and will be thus "densified" prior to the siliciding. Since by this process its etch rate is reduced, this oversiliciding beyond the edges of the protective oxide will be prevented, and smooth silicide edges will be formed.

Returning to FIG. 1, it is noted that through the siliciding of the transistors 7 in the inner portion 1, low resistances of the respective interconnections are achieved. This results in faster transistors. ESD protection is not necessary in the inner portion I of the IC device since no large voltages occur there. In fact, the voltages that occur in the inner portion 1 of the IC device generally do not exceed 5 V. In the edge portion 2 of the IC, however, the outside transistors 7 are endangered because high voltages (on the order of 1000 V) may occur there. In the edge portion 2, therefore, only the inner areas of the source regions 10 and drain regions 11 of the respective transistors 7 are silicided.

Referring to FIGS. 1 and 2, a CVD oxide is used for the protective oxide layer 13. This CVD oxide has high etch selectivity with respect to the oxides used for the field-oxide regions 6 and the spacers 12. This high etch selectivity is achieved by the use of oxides with different etch rates. The ratio of the etch rate of the protective oxide layer to that of the field oxide and the spacer oxide is typically 20:1. The thickness of the protective oxide layer 13 is a few hundred angstroms (Å), with a preferred thickness more than 200Å. Prior to the siliciding, (i.e., prior to the sputtering of titanium, for example) the protective oxide layer 13 is subjected to a high-temperature treatment, such as a pulse annealing process, in which the protective oxide layer is densified. It is this "densification" step which is directly responsible for the reduction in etch rate of the protective oxide layer. In a preferred embodiment of the invention, the heat treatment is a pulse annealing process at a temperature between 800° and 900° C. (preferably 875° C.) and in a time interval of 20 sec to 5 min (preferably 3 min). This temperature treatment changes the "loose structure" of the protective oxide so that during the subsequent siliciding, the selectivity of the silicide formation (i.e., only on the exposed silicon) is fully preserved, and oversiliciding beyond the edges of the protective oxide layer 18 is prevented. Without this "densification" or change in the etch rate caused by the temperature treatment, siliciding on the greater part of the silicon underlying the protective oxide layer 13 would be prevented, but oversiliciding would take place at the edges of the protective oxide layer 13. This oversiliciding could lead to the formation of silicide spikes extending into the protected area. In CMOS devices, particularly those with small critical dimensions (CD), this would involve the risk of high electric field strengths at the spikes, so that ESD protection would be substantially reduced. Through the densification process, however, siliciding beyond the edges of the protective oxide layer is prevented, so that smooth silicide edges are formed.

As should now be apparent, the present invention substantially overcomes many of the problems associated with conventional CMOS devices. In particular, the present invention provides for a CMOS device with ESD protection. This ESD protection consists of protecting from the final siliciding processes those areas of the source and drain regions of the outer transistors in the device which adjoin the field oxide regions and the spacers of the gate regions with an oxide coating. The protective oxide layer is designed to have a greater etch rate than that of the field-oxide regions and the spacers adjoining the gate regions for the selective etching process, but prior to the siliciding process is subjected to a heat treatment whose parameters are chosen to reduce the etch rate of this protective oxide layer. Because of this variation in the etch rate of the protective oxide layer, the field oxide regions and spacers are protected in the selective etching process, and oversiliciding is prevented in the siliciding process. The result is an improved CMOS device when compared to prior art devices.

It should be understood that the embodiments described herein are merely exemplary and that a person skilled in the art may make reasonable variations and modifications to these embodiments utilizing functionally equivalent elements to those described herein. Any and all such variations or modifications as well as others which may become apparent to those skilled in the art, are intended to be included with the scope and spirit of the invention as defined by the appended claims.

What is claimed is:

1. A process for fabricating a CMOS structure with ESD protection comprising the steps of:

forming, in a substrate of a first conductivity type, at least one well region of a second conductivity type;

forming field-oxide regions, gate-oxide regions and spacers on said substrate and said well region, said spacers adjoining said gate oxide regions;

forming source and drain regions associated with said gate-oxide regions, said source and drain regions being of said second conductivity type in said substrate and of said first conductivity type in said well region;

depositing a protective oxide layer on said substrate, said oxide layer being masked so as to cover those areas of said source and drain regions which adjoin said field-oxide regions and said gate regions and;

siliciding said substrate with said masked protective oxide layer as a mask, said oxide layer being characterized in that it has a greater etch rate than said field-oxide regions and said spacers.

2. The process according to claim 1, wherein said protective oxide layer is further characterized in that prior to the siliciding step said protective oxide layer is subjected to a heat treatment whose parameters are chosen so as to reduce its etch rate.

3. The process according to claim 2, wherein said heat treatment comprises a pulse annealing process.

4. The process according to claim 3, wherein said pulse annealing process is carried out at a temperature between 800° C. and 900° C. and in a time interval of 20 sec to 5 min.

5. The process according to claim 4, wherein said pulse annealing process is carried out at 875° C.

6. The process according to claim 4, wherein said pulse annealing process is carried out in 3 min.

7. The process according to claim 2, further characterized in that prior to said heat treatment, a ratio of the etch rate of said protective oxide layer to the etch rate of said field-oxide regions and said spacers is 20:1.

8. The process according to claim 1, wherein said first conductivity type is p-type.

9. The process according to claim 1, wherein said second conductivity type is n-type.

10. The process according to claim 1, wherein said protective oxide layer has a thickness greater than 200Å.

\* \* \* \* \*